United States Patent
Salinas Fox et al.

(10) Patent No.: US 7,724,540 B1
(45) Date of Patent: May 25, 2010

(54) SPACER FOR CIRCUIT BOARDS

(75) Inventors: Victor Hugo Salinas Fox, Guadalupe (MX); Akira Masuda, Yaizu (JP)

(73) Assignee: Yazaki North America, Inc., Canton, MI (US)

( * ) Notice: Subject to any disclaimer, the term of this patent is extended or adjusted under 35 U.S.C. 154(b) by 684 days.

(21) Appl. No.: 11/717,033

(22) Filed: Mar. 13, 2007

(51) Int. Cl.
*H05K 7/12* (2006.01)

(52) U.S. Cl. .................. 361/809; 361/807; 361/758; 361/742; 361/804; 174/138 G

(58) Field of Classification Search ................ 361/742, 361/758, 770, 804, 759, 807; 174/138 G, 174/138 E
See application file for complete search history.

(56) References Cited

U.S. PATENT DOCUMENTS

| | | | |
|---|---|---|---|
| 3,644,868 A | 2/1972 | Nevala | |
| 4,092,698 A * | 5/1978 | Brefka | 361/752 |
| 5,283,712 A | 2/1994 | Michihira et al. | |
| 5,353,190 A * | 10/1994 | Nakayama et al. | 361/647 |
| 5,373,104 A * | 12/1994 | Brauer | 174/562 |
| 5,418,693 A * | 5/1995 | Perry | 361/816 |
| 5,499,160 A | 3/1996 | Burns | |
| 5,671,126 A | 9/1997 | Verding et al. | |
| 5,917,709 A | 6/1999 | Johnson et al. | |
| 6,093,029 A | 7/2000 | Kwon et al. | |
| 6,222,739 B1 | 4/2001 | Bhakta et al. | |
| 6,335,864 B1 * | 1/2002 | Klubenspies | 361/760 |
| 6,545,875 B1 | 4/2003 | Perino et al. | |
| 6,590,781 B2 | 7/2003 | Kollipara et al. | |
| 6,614,664 B2 | 9/2003 | Lee | |
| 6,813,163 B2 | 11/2004 | Inoue et al. | |
| 6,985,367 B1 | 1/2006 | Scigiel | |
| 2005/0254221 A1 | 11/2005 | Kollipara et al. | |

* cited by examiner

*Primary Examiner*—Dameon E Levi
(74) *Attorney, Agent, or Firm*—Daniel R. Edelbrock

(57) ABSTRACT

A spacer or retainer secures two circuit boards in a back-to-back configuration. The spacer has opposite first and second sides, each having a peripheral rim against which the circuit boards fit. Each side is recessed to a depth enabling any component terminals or connections from rear surfaces of the circuit boards to be received in the recesses. Pins on ends of the spacer are received in apertures in the circuit boards to guide the circuit boards into position on the spacer. Two clips are positioned next to each other on one wall forming the peripheral rim. Each clip extends beyond an opposite side, and the clips have resilient tabs biased to press the circuit boards against the rims. The circuit boards are connected by electrical wire extending around an opposite wall of the peripheral rim. The spacer and circuit boards form a subassembly, such as for a vehicle instrument cluster.

20 Claims, 4 Drawing Sheets

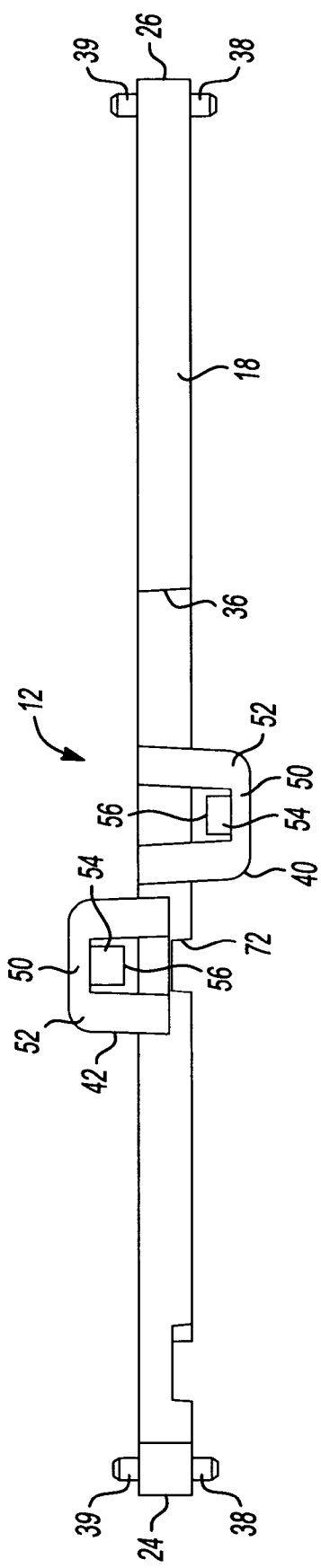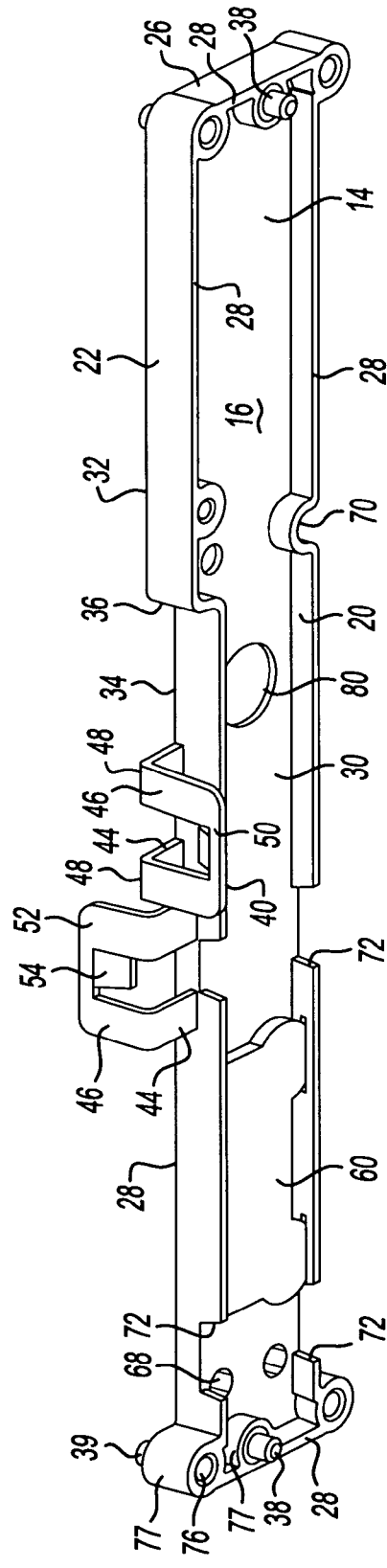

SPACER FOR CIRCUIT BOARDS

BACKGROUND OF THE INVENTION

1. Field of the Invention

The invention relates to a combined spacer and retainer for properly spacing and retaining two circuit boards in a subassembly without the need for using screws or other time-consuming fastening methods.

2. Discussion of Related Art

Typical electronic assemblies requiring multiple circuit boards often secure the circuit boards together by using screws or bolts. This increases the time necessary to complete the final assembly and requires multiple parts, including fasteners and separate spacers. Product cost increases with the number of parts, and the chance of losing or misplacing necessary parts creates additional production problems and expense. Assembly line inefficiencies can occur if the circuit boards are not quickly and properly positioned relative to each other. Though interlocking elements for securing multiple circuit boards together do exist in the art, they are generally not compact and often not reliable. In vehicle instrument cluster assemblies, for example, there is very little room within instrument panels for the requisite electrical components that are mounted on the printed circuit boards. The circuit boards must be correctly separated and spaced to prevent the electrical components, such as connector modules, light emitting diodes and display devices, from interfering with each other. However, the circuit boards must electrically link together in a subassembly that can fit into a constrained area.

SUMMARY OF THE INVENTION

Accordingly, it is an object of this invention to retain two circuit boards together in a compact subassembly without the use of more labor-intensive fastener systems.

Another object of the invention is to keep the circuit boards properly spaced, correctly positioned, and reliably connected such that the electrical components mounted on the circuit boards do not interfere with each other and the circuit boards are not damaged during shipping and handling.

A further object of the invention is to provide this retainer/spacer as a straightforward and inexpensive structure for ease of manufacture and quick assembly with the circuit boards.

In carrying out this invention in the illustrative embodiment thereof, a first printed circuit board (PCB) and a second PCB are electrically and mechanically connected at adjacent flanks by flexible electric wire. The wire acts as a spring hinge, enabling back surfaces of the PCBs to be swung toward each other. A one-piece, molded retainer or spacer is placed between the back surfaces of the PCBs with the electrical component mounting surfaces of the PCBs facing outward. The spacer has integral snap features that secure each PCB against the spacer. The resulting subassembly can then be efficiently inserted into, for example, a vehicle instrument cluster assembly process.

BRIEF DESCRIPTION OF THE DRAWINGS

This invention, together with other objects, features, aspects and advantages thereof, will be more clearly understood from the following description, considered in conjunction with the accompanying drawings.

FIG. 1 is a side view of a circuit board spacer or retainer according to the present invention.

FIG. 2 is a perspective view of the spacer.

DETAILED DESCRIPTION OF THE ILLUSTRATED EMBODIMENT

Figure 3:
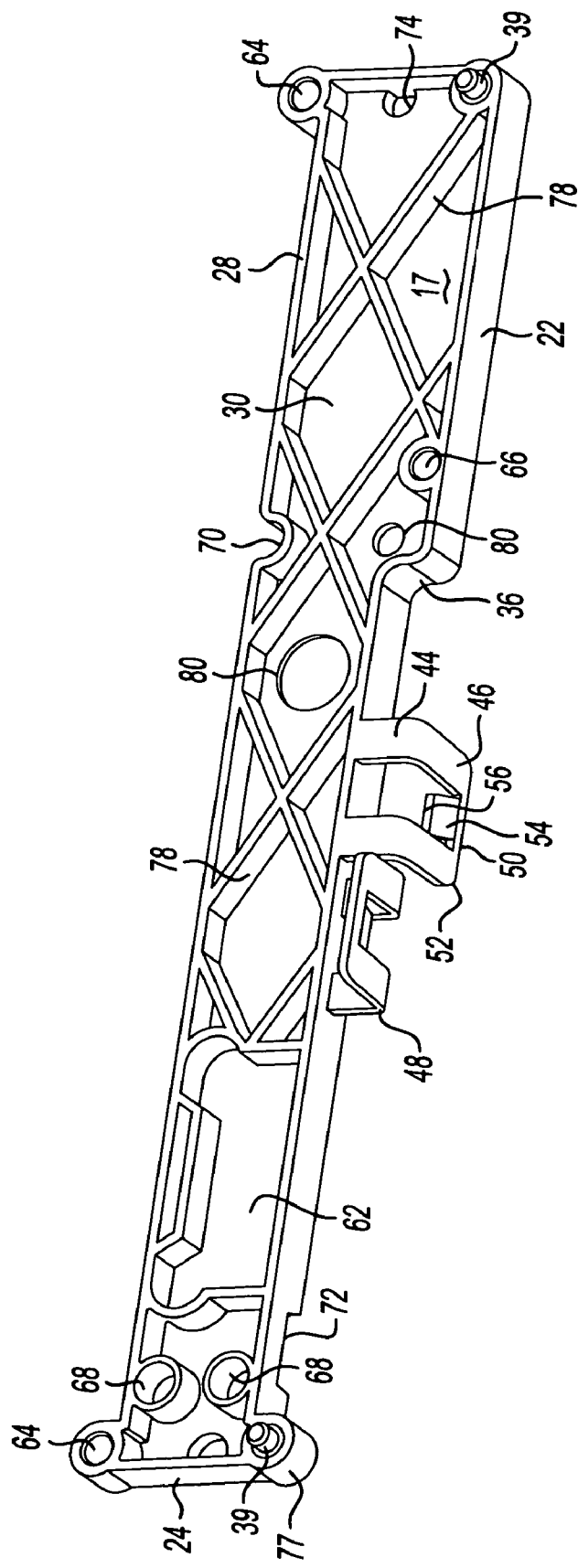
FIG. 3 is a perspective view of the spacer illustrating an opposite surface of the spacer relative to FIG. 2.

Referring now to FIGS. 1-3, a retainer or spacer 12 according to the present invention is molded in one-piece from a suitable, electrically non-conductive plastic such as Polypropylene. The spacer 12 is generally rectangular and has a base 14 with a first generally flat side 16 (FIG. 2) and a second, opposite facing, substantially flat side 17 (FIG. 3). The base 14 is surrounded or bounded by a frame 18 having a first outer perimeter wall 20 and a second, opposite outer perimeter wall 22 joining a first end wall 24 and a second end wall 26. The frame 18 has edges forming a raised peripheral rim 28 around each side of the base. The frame 18 is wider than the base 14 such that a recess 30 of predetermined depth is formed within the bounds of the peripheral rim 28 above each side of the base.

The spacer frame 18 has a shorter, wider portion 32 extending inward from the second end wall 26 and a longer, narrower portion 34 extending inward from the first end wall 24. The wider and narrower portions meet at a junction 36. At the end walls 24 and 26, cylindrical pins 38 and 39 are formed to project perpendicularly outward from each base side immediately adjacent the peripheral rim 28. There are four pins in all, two at each end wall 24 and 26 projecting outward in opposite directions. However, the pins 38 are in the center of the frame at each end wall and the pins 39 each project from a corner of the frame near the second, outer perimeter wall 22.

Two fasteners or clips 40 extend from the frame 18. The clips 40 are located right next to each other in an immediately adjacent, side-by-side configuration on a common wall, specifically the second outer wall 22 of the frame 18 in the narrower portion 34 of the frame. Each clip 40 acts as a snap member and has two spaced, L-shaped arms 42. The arms 42 each have a first section 44 extending perpendicularly outward from a plane of the frame outer wall 22 and a second section 46 extending at a right angle from an end 48 of the first section distal from the frame 18. The second sections 46 of each arm are joined by a third, bridge section 50 at the ends 52 of the arms 42 distal from the frame. A spring tab or resilient tab 54 extends inward from the bridge section 50. The resilient tab 54 is integral with the bridge section 50 and initially, where the tab is joined to the bridge section, in a plane of the second sections 46 of the arms 42, between the second sections. However, the tabs 54 are biased at an angle inward toward the spacer and frame 18 such that a free end 56 of each tab 54 extends over a plane of the base 14 and can be deflected back into the plane of the second sections 46 of the arms 42.

The spacer 12 includes other features that can be designed into the frame 18 and base 14 according to the requirements of the particular environment or main assembly in which the invention is meant to be used. As shown in FIG. 2, a raised platform 60 is formed in the base 14 within the narrow portion 34 of the frame 18. The raised platform creates a deeper indentation 62 (FIG. 3) in the opposite side 17 of the base. Holes 64 in corner locations of the frame 18, opposite the corner locations with the pins 39, enable screws or bolts to extend through the circuit boards and spacer and attach the subassembly between other parts of a main assembly. Hole 66 performs a similar function in a more intermediate location of the spacer. Apertures 68 through the base 14, and inward bulge 70 of the frame 18, prevent the base and frame, respectively, from contacting and interfering with electronic components mounted on the printed circuit boards.

The electronic components can generate excessive heat through the printed circuit boards into the spacer recesses 30. Cuts or slots 72 at various locations in the frame 18 enable venting and dissipation of this heat. Blind holes 74 and 76 on opposite ends of supports 77 for the pins 38 and 39, respectively, eliminate thicker areas in the spacer structure. As well as providing the spacer with a constant thickness, the blind holes 74 and 76 have the benefit of reducing the material needed for the supports and, therefore, reduce the cost and weight of the spacer. One or more of the blind holes could also be used as a locating and aligning feature with parts of a main assembly. The side 17 of the base 14 includes reinforcing ribs 78 (FIG. 3) across the base between the frame walls. One or more holes 80 (only two are shown) between the ribs, like cuts or slots 72 in the frame 18, enable heat dissipation. These features can be located as desired depending on the circuit board design and component configuration.

Figure 4:
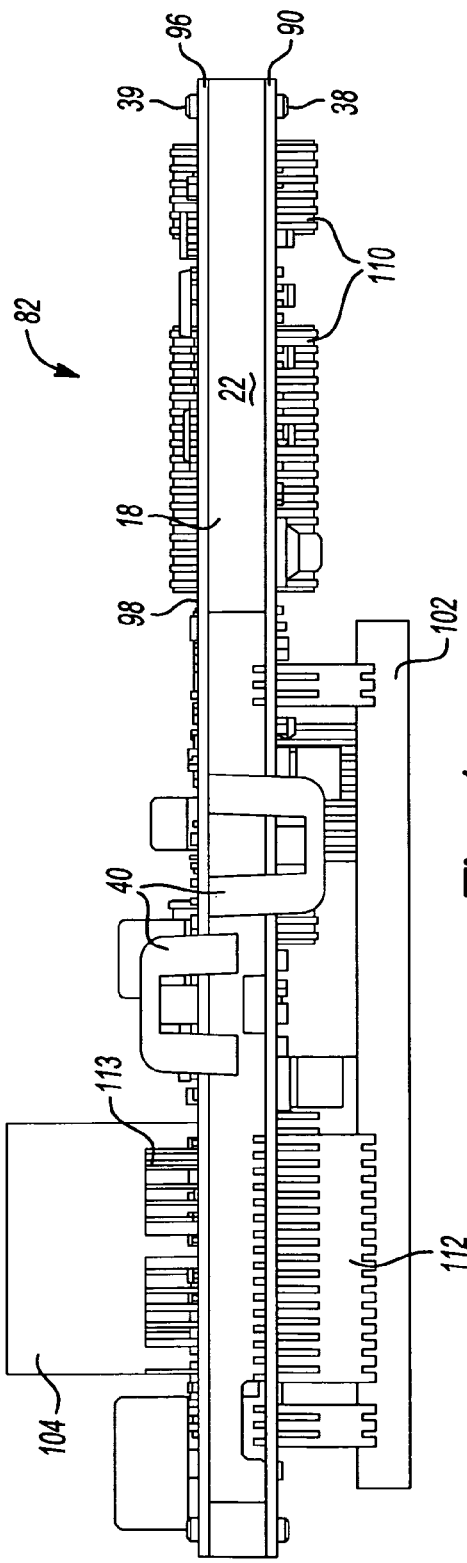
FIG. 4 is a side view of the spacer and printed circuit board (PCB) subassembly.
Figure 5:
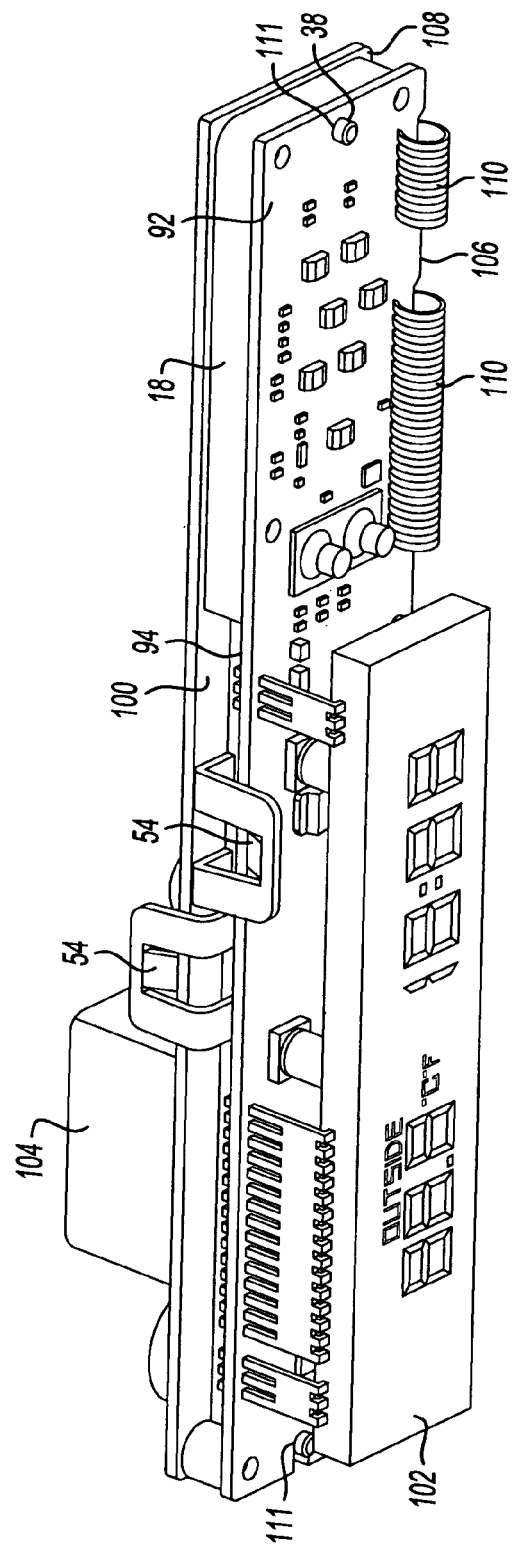
FIG. 5 is a perspective view of the spacer and PCB subassembly.
Figure 6:
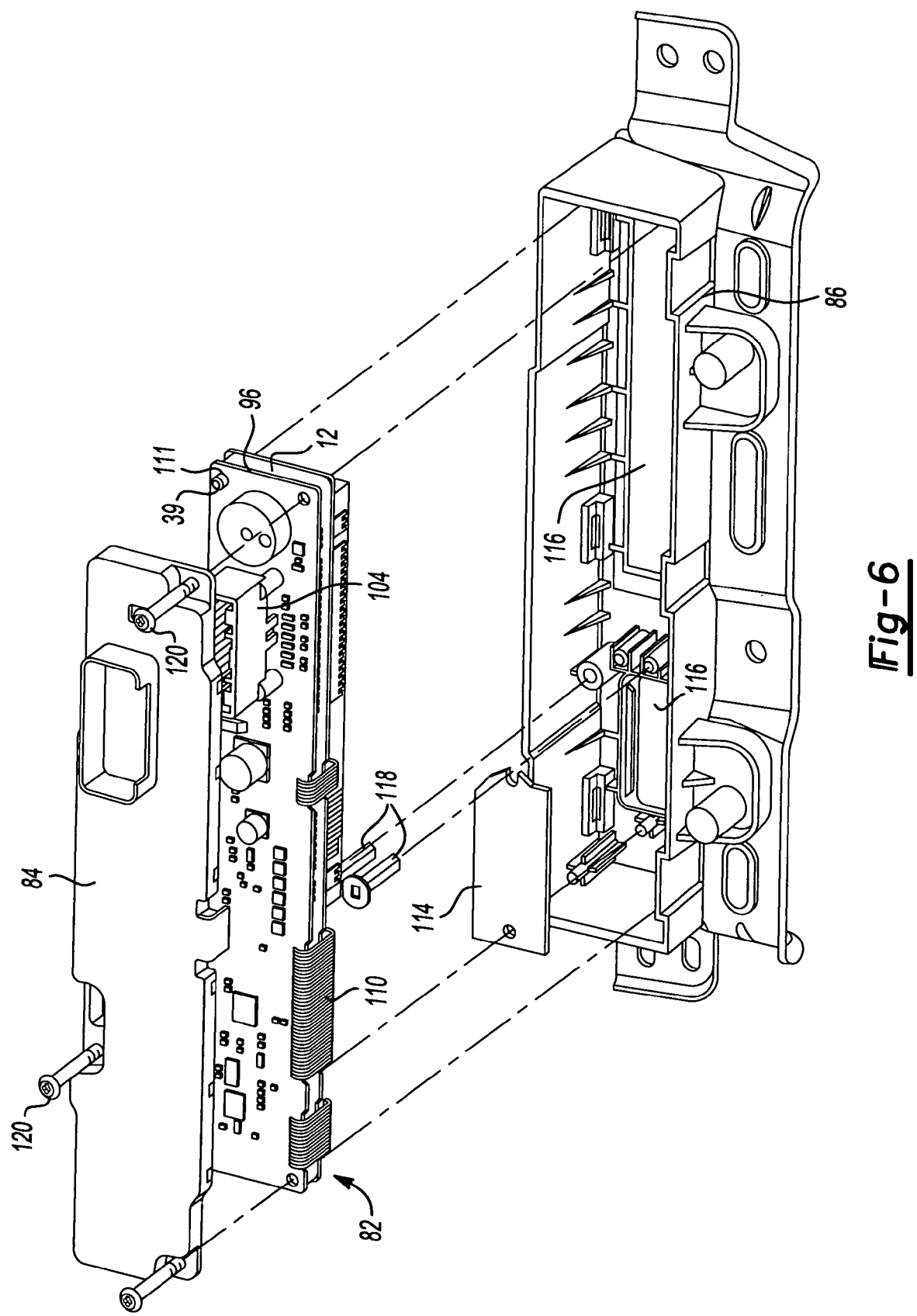
FIG. 6 is an exploded perspective view of a vehicle instrument cluster assembly into which the spacer and PCB subassembly fits.

FIGS. 4-6 illustrate the spacer 12 in use as part of a subassembly 82 for a vehicle instrument cluster. The subassembly 82 is meant, for example, to fit within a main assembly (FIG. 6) including a rear cover 84 and an instrument cluster mask 86 on a vehicle instrument panel. A first printed circuit board (PCB) 90 has a first, front surface 92 on which electronic components are meant to be mounted and an opposite, second or back surface 94. A second PCB 96 also has a first, component surface 98 and an opposite, second or back surface 100. Electronic components are not mounted on the back surfaces 94 and 100. In general, only soldered lead terminals and protruding mounting parts of the components are on these back surfaces. The PCBs function to supply power and to relay vehicle operating information to the cluster, and to provide backlighting to one or more display devices in the instrument cluster. For example, a display device 102 for indicating the outside temperature and time of day is mounted on the component surface 92 of the first PCB 90. An electrical connector 104, for connection to a wire harness for supplying electrical power from the vehicle battery to the display device 102 and other components on the PCBs, is mounted on the component surface 98 of the second PCB 96.

The PCBs are meant to be placed back surface to back surface to conserve space within the instrument panel. The PCBs 90 and 96 are electrically and mechanically connected at adjacent flanks 106 and 108, respectively, by flexible electrical wire 110. The wire 110 acts as a resilient or flexible hinge, allowing the second or back surfaces 94 and 100 of the PCBs to flip or swing and approach each other. The spacer 12 is sandwiched between them.

Guide holes 111 in the PCBs receive the pins 38 and 39 of the spacer to guide the PCBs into proper alignment on the spacer. The guide holes and pins can be used in various ways to ensure that each PCB is assembled on the correct side of the spacer base 14. For example, as illustrated in FIG. 6, the guide holes 111 (only one is shown) are in the corners of the PCB 96. Therefore, the PCB 96 cannot be guided onto the pins 38 in the center of the frame end walls 24 and 26 over the base side 16. In other words, the PCB 96 can only be assembled over the second side 17 of the spacer base with the guide holes 111 receiving the pins 39, providing a fool-proof assembly order. This means, in this example, that the terminals and securing screws extending through the PCB 96 from the connector 104 will be received in the deeper indentation 62 of the spacer base side 17 as intended.

The retainer or spacer 12 of the subassembly 82 is used to hold the PCBs in this back-to-back condition with the electrical components spaced so as not to interfere with each other. As best shown in FIG. 4, some of the components, such as a lead frame 112 from the display device 102, have terminals or other parts that protrude beyond the back and edge surfaces of the PCBs. The recesses 30 formed in the spacer 12 by the peripheral rims 28 receive these protruding terminals or parts and space and separate them from each other on opposite surfaces of the base 14 as the PCBs are pressed against the peripheral rims 28. Protruding terminals 113 of the connector 104, as well as screws (not shown) securing the connector to the PCB 96, are received in the deeper indentation 62 within the base side 17, preventing contact with the spacer.

Positioning the clips 40 close together on a common outer wall 22 of the spacer 12 keeps the clips out of the way of circuit connections, without causing a loss in retaining reliability. Because the clips 40 are located in the narrower portion 34 of the spacer 12, the resilient tabs 54 are deflected into the planes of the second sections 46 of the arms 42 as the PCBs 90 and 96 are moved toward the peripheral rims 28. As the PCBs are pressed or abut against the peripheral rims, the tabs 54 snap back and retain the PCBs in position against the rims by applying force on the component surfaces 92 and 98 of the PCBs 90 and 96, respectively.

The invention has been described and illustrated for use with a vehicle instrument cluster assembly. However, any apparatus or assembly process requiring a compact subassembly of multiple circuit boards could benefit from use and implementation of the described spacer/retainer. As depicted in FIG. 6, the subassembly 82 allows a very compact instrument cluster main assembly. Various other parts, such as one or more dial or display appliqués 114 for viewing through cluster mask windows 116, push buttons 118 for setting time or other parameters on the display devices, and lamp housings (not shown) for backlighting the appliqués, can be fit into the main assembly. Screws 120 pass through the rear cover 84, then through holes in the printed circuit boards and holes 64 and 66 in the spacer, into the instrument cluster mask 86 to fix the main assembly together.

Since minor changes and modifications varied to fit particular operating requirements and environments will be understood by those skilled in the art, this invention is not considered limited to the specific examples chosen for purposes of illustration. The invention is meant to include all changes and modifications which do not constitute a departure from the true spirit and scope of this invention as claimed in the following claims and as represented by reasonable equivalents to the claimed elements.

What is claimed is:

1. A spacer for correctly positioning and holding a first and a second circuit board in a subassembly, each circuit board having a first surface carrying electrical components and a second, opposite surface, the circuit boards being electrically and mechanically joined at one set of adjacent flanks by electrical wire, the spacer comprising:

a first side having a peripheral rim, the second surface of the first circuit board fitting against the rim such that the first surface of the first circuit board faces outward away from the spacer;

a second, opposite side having a peripheral rim, the second surface of the second circuit board fitting against the rim of the second opposite side such that the first surface of the second circuit board faces outward away from the spacer;

a first outer wall around which the electrical wire extends when the circuit boards are pressed against the rims; and a second, opposite outer wall, the second wall having closely positioned clips extending in opposite directions past the first and second sides of the spacer, each clip including a resilient tab biased over a corresponding side of the spacer and located such that when the circuit boards are pressed against the peripheral rims the tabs apply a holding force against the first surfaces of the circuit boards.

2. The spacer of claim 1 wherein the spacer is a one-piece part.

3. The spacer of claim 1 wherein the spacer has opposite end walls, and further comprising pins projecting from the end walls for aligning the circuit boards as the circuit boards are pressed against the rims.

4. The spacer of claim 1 wherein each clip has two arms, each arm having a first section extending perpendicularly from the second outer wall of the spacer and a second section extending at a right angle from the first section, the second sections being joined by a bridging section at ends of the second sections distal from the first sections.

5. The spacer of claim 4 wherein the outer walls bound wider and narrower portions of the spacer, and the clips extend from the second outer wall in the narrower portion.

6. The spacer of claim 4 wherein the resilient tabs extend from the bridge elements between the second sections of the arms.

7. The spacer of claim 6 wherein the tabs are resiliently biased at an angle toward the spacer.

8. A subassembly for a vehicle instrument cluster, the subassembly comprising:

a first circuit board;

a display device operatively attached to a surface of the first circuit board;

a second circuit board electrically engaged with the first circuit board and having an electrical connector mounted on a surface of the second circuit board for connection to a source of power; and a retainer sandwiched between the first and second circuit boards, the retainer having a first snap member positioned to apply force directly on the surface of the first circuit board and a second snap member positioned to apply force directly on the surface of the second circuit board for securing the circuit boards to the retainer.

9. The subassembly of claim 8 wherein the retainer has first and second opposite sides, and the first snap member secures the first circuit board over the first side and the second snap member secures the second circuit board over the second side.

10. The subassembly of claim 9 wherein the snap members are each located on a common outer wall of the retainer.

11. The subassembly of claim 10 wherein the snap members are positioned immediately adjacent to each other.

12. The subassembly of claim 11 wherein the snap members each include a resilient tab, each resilient tab being biased over an opposite side of the retainer.

13. The subassembly of claim 10 wherein flexible electrical wire connects the circuit boards around an opposite outer wall of the retainer.

14. A retainer for holding and positioning two circuit boards in a predetermined spatial orientation relative to each other, the retainer comprising:

a peripheral frame forming a perimeter around two oppositely facing recesses, the frame having a first end wall and a second end wall, the frame further having a narrower portion extending inward from the first end wall and a relatively wider portion extending inward from the second end wall such that the narrower portion and the wider portion meet along a length of the frame between the end walls;

first and second fasteners positioned side-by-side on the frame, each fastener having a first section extending perpendicularly outward from the narrower portion of the frame and a second section extending at a right angle from the first section, each fastener having a resilient tab, the resilient tab of the first fastener extending over a first of the recesses, the resilient tab of the second fastener extending over a second of the recesses.

15. The retainer of claim 14 further comprising a first set of pins extending in opposite directions from the first end wall and a second set of pins extending in opposite directions from the second end wall, the pins being sized to be received in guide holes of the circuit boards.

16. The retainer of claim 14 wherein the peripheral frame surrounds a base with first and second opposite facing sides, each of the two recesses being located above a side of the base.

17. The retainer of claim 14 wherein the resilient tabs are located within the second sections of the fasteners such that they are biased toward a plane of the frame.

18. The retainer of claim 14 wherein the retainer is a one-piece, molded plastic part.

19. The retainer of claim 16 wherein the base is positioned within the frame to set a depth of each recess such that components of the circuit boards are prevented from interfering with the circuit boards being pressed against the frame by the resilient tabs.

20. The retainer of claim 16 further comprising apertures through the base and slots through the frame at various locations to accommodate circuit board components and to dissipate heat.

* * * * *